(12) United States Patent
Cheng et al.

(10) Patent No.: US 10,522,496 B2
(45) Date of Patent: Dec. 31, 2019

(54) METHOD FOR A STACKED AND BONDED SEMICONDUCTOR DEVICE

(71) Applicant: Taiwan Semiconductor Manufacturing Company, Ltd., Hsinchu (TW)

(72) Inventors: Li-Hui Cheng, New Taipei (TW); Po-Hao Tsai, Zhongli (TW); Jing-Cheng Lin, Hsinchu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 24 days.

(21) Appl. No.: 15/497,785

(22) Filed: Apr. 26, 2017

(65) Prior Publication Data

US 2017/0229414 A1    Aug. 10, 2017

Related U.S. Application Data

(62) Division of application No. 14/460,089, filed on Aug. 14, 2014, now Pat. No. 9,646,918.

(51) Int. Cl.
*H01L 23/00* (2006.01)
*H01L 23/28* (2006.01)
(Continued)

(52) U.S. Cl.
CPC .......... *H01L 24/24* (2013.01); *H01L 21/4853* (2013.01); *H01L 21/56* (2013.01);
(Continued)

(58) Field of Classification Search
CPC . H01L 2224/023–024; H01L 24/26–33; H01L 2924/00014; H01L 2224/19; H01L 2224/02311; H01L 2224/02313; H01L 2224/02379; H01L 2224/02381; H01L 2224/73259; H01L 2221/68359; H01L 2221/68381; H01L 2224/12105; H01L 2224/32145; H01L 2224/32225; H01L 224/48091; H01L 2224/48227; H01L 2224/73265; H01L 2224/73267; H01L 2224/92244; H01L 2224/97; H01L 2225/0651; H01L 2225/1035; H01L 2225/1058; H01L 2225/1082; H01L 2924/15311; H01L 2225/06568; H01L 2224/83; H01L 23/3128; H01L 23/49816; H01L 24/24; H01L 24/02; H01L 24/12;
(Continued)

(56) References Cited

U.S. PATENT DOCUMENTS 6,486,054 B1   11/2002  Fan et al.
2008/0283959 A1   11/2008  Chen et al.
(Continued)

*Primary Examiner* — Laura M Menz
*Assistant Examiner* — Candice Chan
(74) *Attorney, Agent, or Firm* — Slater Matsil, LLP

(57) ABSTRACT

A semiconductor device and method utilizing a dummy structure in association with a redistribution layer is provided. By providing the dummy structure adjacent to the redistribution layer, damage to the redistribution layer may be reduced from a patterning of an overlying passivation layer, such as by laser drilling. By reducing or eliminating the damage caused by the patterning, a more effective bond to an overlying structure, such as a package, may be achieved.

20 Claims, 10 Drawing Sheets

(51) Int. Cl.
  *H01L 21/768* (2006.01)
  *H01L 21/56* (2006.01)
  *H01L 23/48* (2006.01)
  *H01L 21/48* (2006.01)
  *H01L 25/10* (2006.01)
  *H01L 25/00* (2006.01)
  *H01L 21/683* (2006.01)
  *H01L 23/498* (2006.01)
  *H01L 23/31* (2006.01)

(52) U.S. Cl.
  CPC ...... *H01L 21/6835* (2013.01); *H01L 21/6836* (2013.01); *H01L 21/76838* (2013.01); *H01L 23/28* (2013.01); *H01L 23/481* (2013.01); *H01L 24/02* (2013.01); *H01L 24/12* (2013.01); *H01L 24/19* (2013.01); *H01L 24/48* (2013.01); *H01L 24/73* (2013.01); *H01L 24/97* (2013.01); *H01L 25/105* (2013.01); *H01L 25/50* (2013.01); *H01L 23/3128* (2013.01); *H01L 23/49816* (2013.01); *H01L 2221/68359* (2013.01); *H01L 2221/68381* (2013.01); *H01L 2224/02311* (2013.01); *H01L 2224/02313* (2013.01); *H01L 2224/02379* (2013.01); *H01L 2224/02381* (2013.01); *H01L 2224/12105* (2013.01); *H01L 2224/19* (2013.01); *H01L 2224/32145* (2013.01); *H01L 2224/32225* (2013.01); *H01L 2224/48091* (2013.01); *H01L 2224/48227* (2013.01); *H01L 2224/73259* (2013.01); *H01L 2224/73265* (2013.01); *H01L 2224/73267* (2013.01); *H01L 2224/83005* (2013.01); *H01L 2224/92244* (2013.01); *H01L 2224/97* (2013.01); *H01L 2225/0651* (2013.01); *H01L 2225/06568* (2013.01); *H01L 2225/1035* (2013.01); *H01L 2225/1058* (2013.01); *H01L 2225/1082* (2013.01); *H01L 2924/00014* (2013.01); *H01L 2924/15311* (2013.01)

(58) Field of Classification Search
  CPC ....... H01L 24/48; H01L 24/73; H01L 23/481; H01L 21/6835; H01L 21/6836; H01L 24/19; H01L 24/97; H01L 25/50; H01L 21/4853; H01L 25/105; H01L 23/28; H01L 21/76838; H01L 21/56
  See application file for complete search history.

(56) References Cited

U.S. PATENT DOCUMENTS

| | | |
|---|---|---|
| 2010/0133704 A1 | 6/2010 | Marimuthu et al. |
| 2011/0215457 A1 | 9/2011 | Park |
| 2012/0012985 A1* | 1/2012 | Shen .................. H01L 23/3171 257/618 |
| 2013/0093078 A1* | 4/2013 | Lin ....................... H01L 21/568 257/737 |
| 2013/0140691 A1* | 6/2013 | Bao .................... H01L 23/3114 257/737 |
| 2013/0292831 A1 | 11/2013 | Liu et al. |
| 2014/0117530 A1* | 5/2014 | Breymesser .......... H01L 23/291 257/734 |
| 2015/0371947 A1 | 12/2015 | Chen et al. |

* cited by examiner

METHOD FOR A STACKED AND BONDED SEMICONDUCTOR DEVICE

This application is a division of U.S. patent application Ser. No. 14/460,089, filed Aug. 14, 2014, and entitled "Semiconductor Device and Method," which application is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
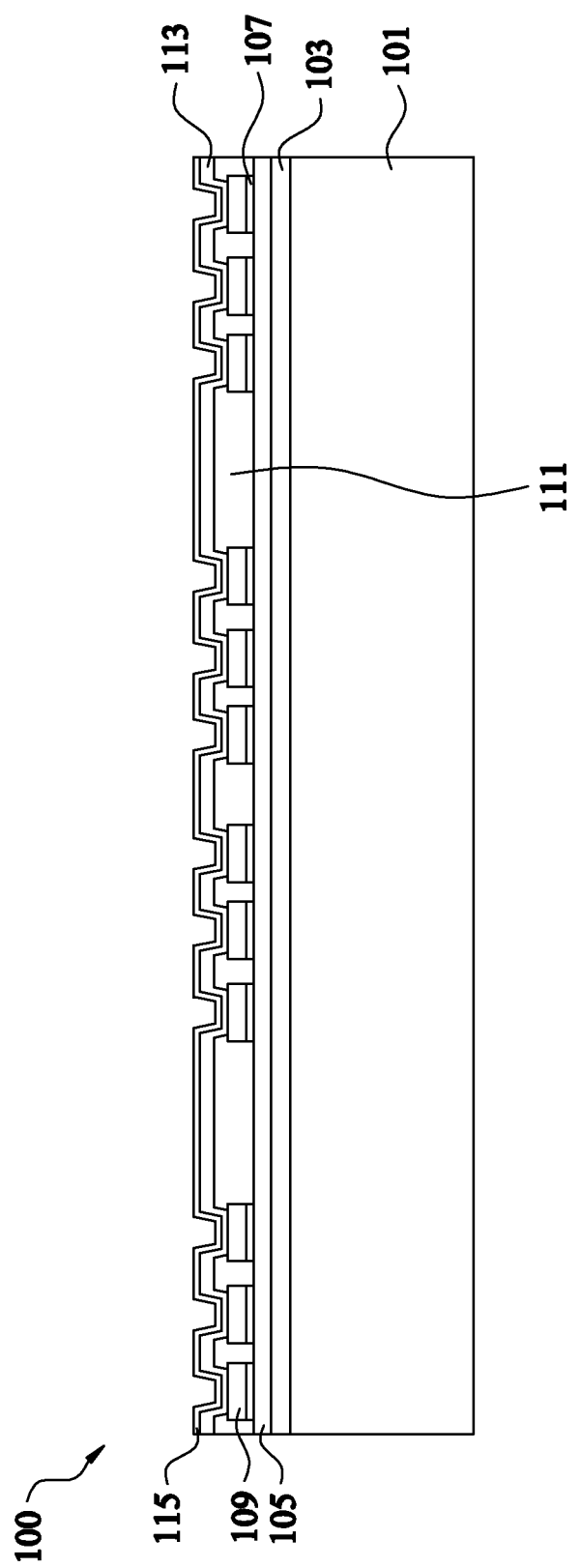
FIG. 1 illustrates a redistribution layer over a carrier wafer in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Looking now at the figures, there is illustrated embodiments used to provide an integrated fan-out (InFO) package. However, embodiments may be used in other packages as well.

FIG. 1 illustrates an intermediate product in a process of forming, e.g., a first package 100, such as an integrated fan out (InFO) package. As illustrated in FIG. 1, the intermediate structure comprises a carrier substrate 101, an adhesive layer 103, a polymer layer 105, a first seed layer 107, a first redistribution layer (RDL) 109, a first passivation layer 111, a second seed layer 113, and a third seed layer 115. The carrier substrate 101 comprises, for example, silicon based materials, such as glass or silicon oxide, or other materials, such as aluminum oxide, combinations of any of these materials, or the like. The carrier substrate 101 is planar in order to accommodate an attachment of semiconductor devices such as a first semiconductor device 401 (not illustrated in FIG. 1 but illustrated and described below with respect to FIG. 4) and a second semiconductor device 403 (also not illustrated in FIG. 1 but illustrated and described below with respect to FIG. 4).

The adhesive layer 103 is placed on the carrier substrate 101 in order to assist in the adherence of overlying structures (e.g., the polymer layer 105). In an embodiment the adhesive layer 103 may comprise an ultra-violet glue, which loses its adhesive properties when exposed to ultra-violet light. However, other types of adhesives, such as pressure sensitive adhesives, radiation curable adhesives, epoxies, an Ajinomoto build-up film (ABF), combinations of these, or the like, may also be used. The adhesive layer 103 may be placed onto the carrier substrate 101 in a semi-liquid or gel form, which is readily deformable under pressure.

The polymer layer 105 is placed over the adhesive layer 103 and is utilized in order to provide protection to, e.g., the first semiconductor device 401 and the second semiconductor device 403 once the first semiconductor device 401 and the second semiconductor device 403 have been attached. In an embodiment the polymer layer 105 may be polybenzoxazole (PBO), although any suitable material, such as polyimide or a polyimide derivative, may alternatively be utilized. The polymer layer 105 may be placed using, e.g., a spin-coating process to a thickness of between about 2 µm and about 15 µm, such as about 5 µm, although any suitable method and thickness may alternatively be used.

The first seed layer 107 is a thin layer of a conductive material that aids in the formation of a thicker layer during subsequent processing steps. The first seed layer 107 may comprise a layer of titanium about 1,000 Å thick followed by a layer of copper about 5,000 Å thick. The first seed layer 107 may be created using processes such as sputtering, evaporation, or PECVD processes, depending upon the desired materials. The first seed layer 107 may be formed to have a thickness of between about 0.3 µm and about 1 µm, such as about 0.5 µm.

Once the first seed layer 107 has been formed the first RDL 109 may be formed over the first seed layer 107. In an embodiment the first RDL 109 comprises one or more conductive materials, such as copper, tungsten, other conductive metals, or the like, and may be formed, for example, by electroplating, electroless plating, or the like. In an embodiment, a first photoresist (not separately illustrated in FIG. 1) is placed on the first seed layer 107 and patterned to expose the first seed layer 107 where the first RDL 109 is desired to be formed. Once patterned, an electroplating process is used wherein the first seed layer 107 and the first photoresist are submerged or immersed in an electroplating solution. The first seed layer 107 surface is electrically connected to the negative side of an external DC power supply such that the first seed layer 107 functions as the cathode in the electroplating process. A solid conductive anode, such as a copper anode, is also immersed in the solution and is attached to the positive side of the power supply. The atoms from the anode are dissolved into the solution, from which the cathode, e.g., the first seed layer 107, acquires the dissolved atoms, thereby plating the exposed conductive areas of the first seed layer 107 within the opening of the first photoresist.

Once the redistribution layer 109 has been formed using the first photoresist and the first seed layer 107, the first photoresist may be removed using a suitable removal process. In an embodiment, a plasma ashing process may be used to remove the first photoresist, whereby the temperature of the first photoresist may be increased until the first photoresist experiences a thermal decomposition and may be removed. However, any other suitable process, such as a wet strip, may alternatively be utilized. The removal of the first photoresist may expose the underlying portions of the first seed layer 107.

After the removal of the first photoresist exposes the underlying first seed layer 107, these portions are removed. In an embodiment the exposed portions of the first seed layer 107 (e.g., those portions that are not covered by the first RDL 109) may be removed by, for example, a wet or dry etching process. For example, in a dry etching process reactants may be directed towards the first seed layer 107, using the first RDL 109 as a mask. Alternatively, etchants may be sprayed or otherwise put into contact with the first seed layer 107 in order to remove the exposed portions of the first seed layer 107.

Once the first RDL 109 has been formed, the first passivation layer 111 is formed over the first RDL 109. In an embodiment the first passivation layer 111 may be polybenzoxazole (PBO), although any suitable material, such as polyimide or a polyimide derivative, may alternatively be utilized. The first passivation layer 111 may be placed using, e.g., a spin-coating process to a thickness of between about 2 µm and about 15 µm, such as about 5 µm, although any suitable method and thickness may alternatively be used. Once in place, the first RDL 109 may be exposed through the first passivation layer 111 by removing a portion of the first passivation layer 111 through a process such as photolithographic masking and etching or chemical mechanical polishing (CMP), although any suitable removal process may alternatively be utilized.

The second seed layer 113 is a thin layer of a conductive material that aids in the formation of a thicker layer during subsequent processing steps. The second seed layer 113 may comprise a layer of titanium about 1,000 Å thick. The second seed layer 113 may be created using processes such as sputtering, evaporation, or PECVD processes, depending upon the desired materials. The second seed layer 113 may be formed to have a thickness of between about 0.3 µm and about 1 µm, such as about 0.5 µm.

The third seed layer 115 is a thin layer of a conductive material that aids in the formation of a thicker layer during subsequent processing steps. The third seed layer 115 may comprise a layer of copper about 5,000 Å thick. The third seed layer 115 may be created using processes such as sputtering, evaporation, or PECVD processes, depending upon the desired materials. The third seed layer 115 may be formed to have a thickness of between about 0.3 µm and about 1 µm, such as about 0.5 µm.

Figure 2:
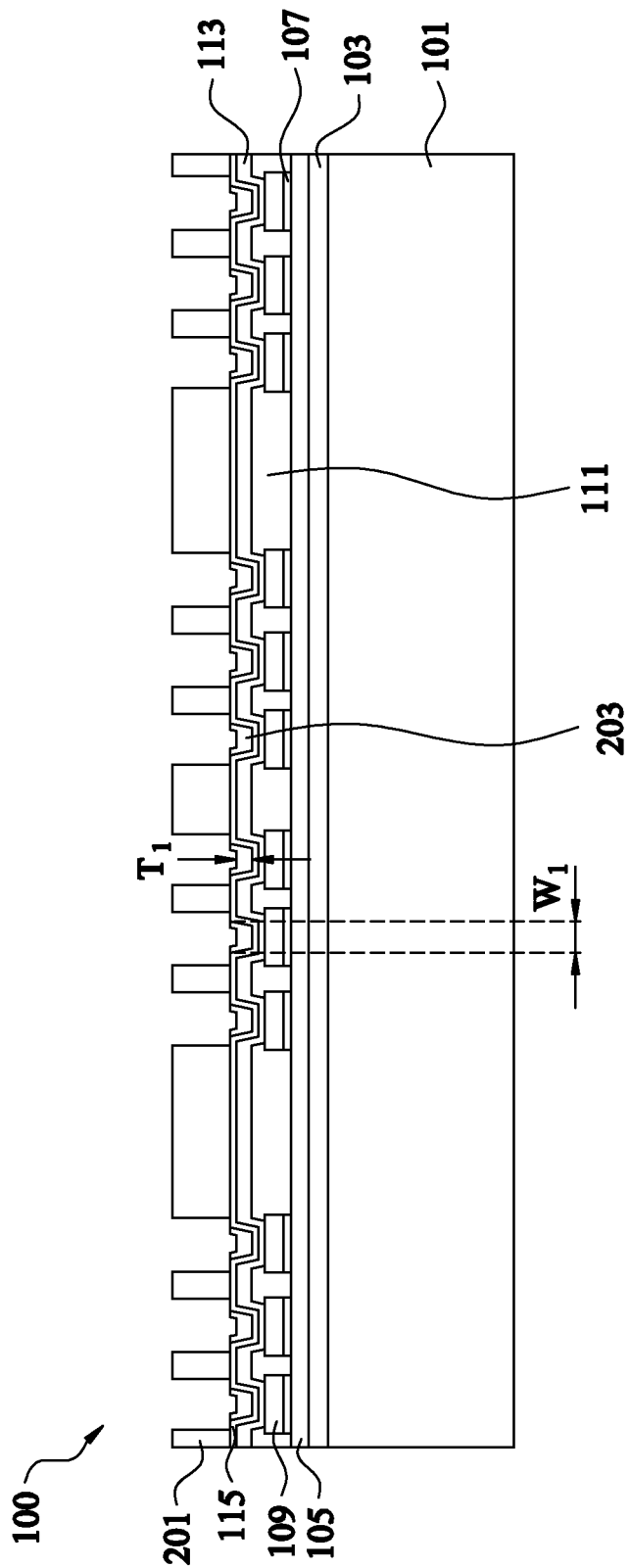
FIG. 2 illustrates a formation of a dummy structure in accordance with some embodiments.

FIG. 2 illustrates a placement of a second photoresist 201 and a formation of a back-side dummy pattern 203 that will be used to reduce damage caused by an exposure process such as laser drilling (not illustrated in FIG. 2 but illustrated and discussed further below with respect to FIG. 8). In an embodiment the second photoresist 201 is a photosensitive material and may be placed over the third seed layer 115 using, e.g., a spin-on technique. Once in place, the second photoresist 201 may be exposed to a patterned energy source (e.g., a patterned light source) so as to induce a chemical reaction in those portions of the second photoresist 201 exposed to the patterned light source. A developer is then applied to the exposed second photoresist 201 to take advantage of the physical changes and selectively remove either the exposed portion of the second photoresist 201 or the unexposed portion of the second photoresist 201, depending upon the desired pattern and form the desired pattern for the back-side dummy pattern 203.

Once the second photoresist 201 has been patterned, the back-side dummy pattern 203 is formed within the second photoresist 201. In an embodiment the back-side dummy pattern 203 comprise one or more conductive materials, such as copper, tungsten, other conductive metals, or the like, and may be formed, for example, by electroplating, electroless plating, or the like. In an embodiment, an electroplating process is used wherein the second seed layer 113 and the third seed layer 115 and the second photoresist 201 are submerged or immersed in an electroplating solution. The surface of the third seed layer 115 is electrically connected to the negative side of an external DC power supply such that the third seed layer 115 functions as the cathode in the electroplating process. A solid conductive anode, such as a copper anode, is also immersed in the solution and is attached to the positive side of the power supply. The atoms from the anode are dissolved into the solution, from which the cathode, e.g., the third seed layer 115, acquires the dissolved atoms, thereby plating the exposed conductive areas of the third seed layer 115 within the opening of the second photoresist 201.

In an embodiment the back-side dummy pattern 203 is formed to have a thickness suitable to reduce or eliminate the damage caused by the exposure process. For example, in an embodiment, the back-side dummy pattern 203 may have a first thickness $T_1$ over the third seed layer 115 of between about 0.5 µm and about 20 µm, such as about 10 µm. However, any suitable thickness may alternatively be utilized. Additionally, the back-side dummy pattern 203 may have a first width $W_1$ of between about 50 µm and about 500 µm, such as about 250 µm.

Figure 3:
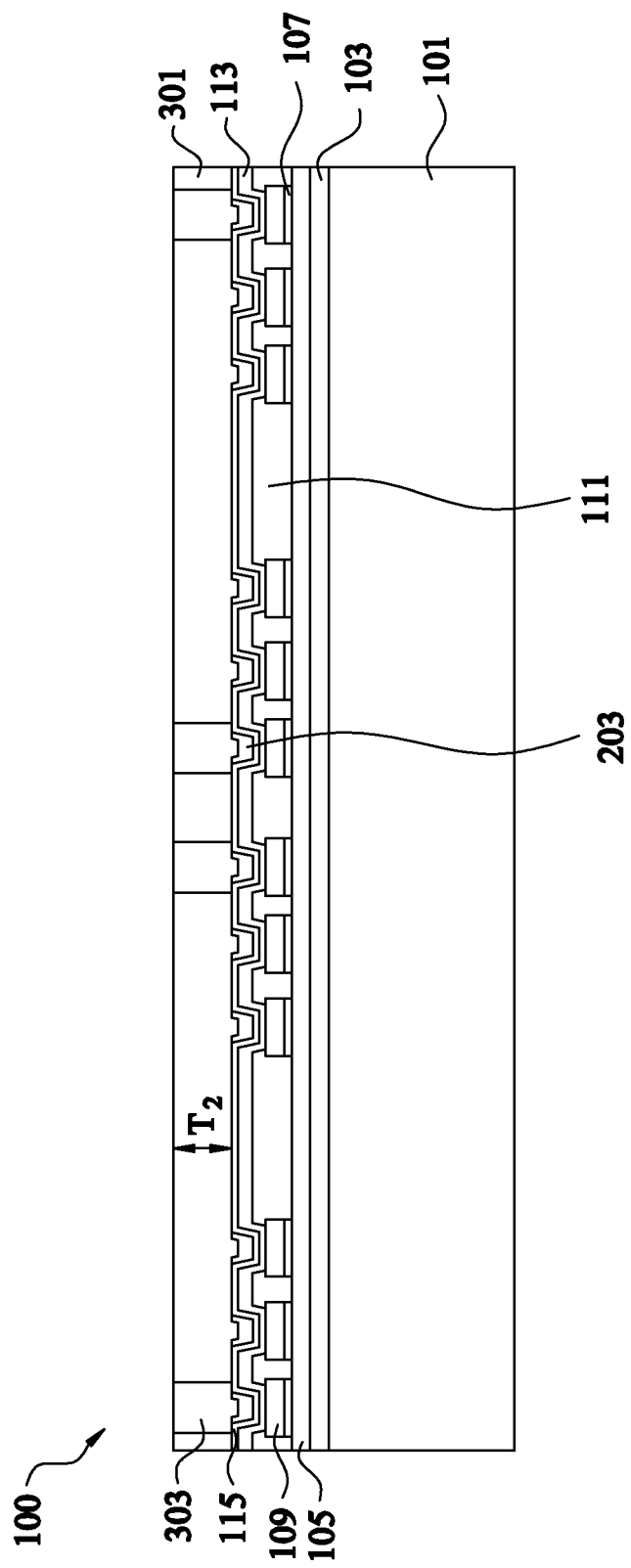
FIG. 3 illustrates a formation of through vias in accordance with some embodiments.

FIG. 3 illustrates a removal of the second photoresist 201, a placement of a third photoresist 301, and a formation of through vias 303. In an embodiment the second photoresist 201 may be removed using a suitable removal process, such as an ashing process. In an embodiment, a plasma ashing process may be used to remove the second photoresist 201, whereby the temperature of the second photoresist 201 may be increased until the second photoresist 201 experiences a thermal decomposition and may be removed. However, any other suitable process, such as a wet strip, may alternatively be utilized.

The third photoresist 301 is placed over the third seed layer 115 and the back-side dummy pattern 203 and patterned to form openings for the formation of the through vias 303. In an embodiment the third photoresist 301 is a photosensitive material and may be placed over the third seed layer 115 and the back-side dummy pattern 203 using, e.g., a spin-on technique. Once in place, the third photoresist 301 may be exposed to a patterned energy source (e.g., a patterned light source) so as to induce a chemical reaction in those portions of the third photoresist 301 exposed to the patterned light source. A developer is then applied to the exposed third photoresist 301 to take advantage of the physical changes and selectively remove either the exposed portion of the third photoresist 301 or the unexposed portion of the third photoresist 301, depending upon the desired pattern, and form the desired pattern for the through vias 303.

Once the third photoresist 301 has been patterned, the through vias 303 (e.g., through InFO vias, or TIVs) are formed within the third photoresist 301. In an embodiment the through vias 303 comprise one or more conductive materials, such as copper, tungsten, other conductive metals, or the like, and may be formed, for example, by electroplating, electroless plating, or the like. In an embodiment, an electroplating process is used wherein the back-side dummy pattern 203 and the third photoresist 301 are submerged or immersed in an electroplating solution. The back-side dummy pattern 203 surface is electrically connected to the negative side of an external DC power supply such that the back-side dummy pattern 203 functions as the cathode in the electroplating process. A solid conductive anode, such as a copper anode, is also immersed in the solution and is attached to the positive side of the power supply. The atoms from the anode are dissolved into the solution, from which the cathode, e.g., the back-side dummy pattern 203, acquires the dissolved atoms, thereby plating the exposed conductive areas of the back-side dummy pattern 203 within the opening of the third photoresist 301.

The plating process may be continued to fill and/or overfill the openings within the patterned third photoresist 301. If overfilled, any excess material outside of the openings may be removed using, e.g., a planarization process such as a chemical mechanical polish. In such an embodiment chemical etchants and abrasives are applied to the excess material and a grinding pad is utilized to grind away the excess material until the excess material outside of the openings are removed and the through vias 303 are planar with the third photoresist 301.

In an embodiment the through vias 303 may be formed to have a second thickness $T_2$ that is larger than the first thickness $T_1$ (of the back-side dummy pattern 203). For example, in the embodiment in which the back-side dummy structure 203 has the first thickness $T_1$ as described above, the second thickness $T_2$ may have a thickness of between about 30 µm and about 350 µm, such as about 200 µm. However, any suitable thickness may alternatively be used.

Figure 4:
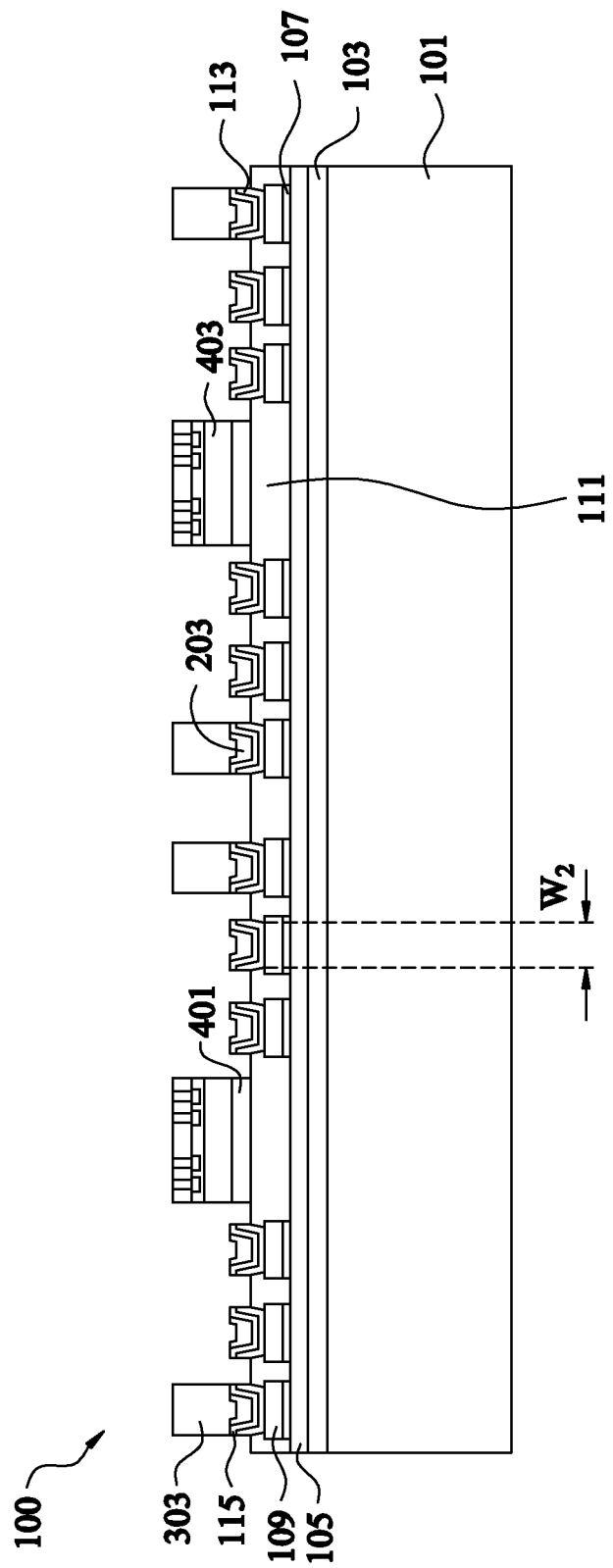
FIG. 4 illustrates a placement of a first semiconductor device and a second semiconductor device in accordance with some embodiments.

FIG. 4 illustrates a removal of the third photoresist 301 along with a placement of the first semiconductor device 401 and the second semiconductor device 403. In an embodiment, a plasma ashing process may be used to remove the third photoresist 301, whereby the temperature of the third photoresist 301 may be increased until the third photoresist 301 experiences a thermal decomposition and may be removed. However, any other suitable process, such as a wet strip, may alternatively be utilized. The removal of the third photoresist 301 may expose the underlying portions of the third seed layer 115.

After the removal of the third photoresist 301 exposes the underlying third seed layer 115 and second seed layer 113, these portions are removed. In an embodiment the exposed portions of the third seed layer 115 (e.g., those portions that are not covered by the through vias 303 or the back-side dummy pattern 203) may be removed by, for example, a wet or dry etching process. For example, in a dry etching process reactants may be directed towards the third seed layer 115, using the through vias 303 or the back-side dummy pattern 203 as masks. Alternatively, etchants may be sprayed or otherwise put into contact with the third seed layer 115 and the second seed layer 113 in order to remove the exposed portions of the third seed layer 115 and the second seed layer 113. After the exposed portion of the third seed layer 115 and the second seed layer 113 has been etched away, a portion of the first passivation layer 111 is exposed between the through vias 303.

In an embodiment the patterning of the third seed layer 115 and the second seed layer 113 form a structure with a second width $W_2$ that is less than the first width $W_1$. For example, in an embodiment in which the first width $W_1$ is as described above, the second width $W_2$ may be between about 50 µm and about 500 µm, such as about 250 µm. However, any suitable dimension may alternatively be utilized.

After the third seed layer 115 and second seed layer 113 have been patterned, the first semiconductor device 401 and the second semiconductor device 403 may be placed on the exposed first passivation layer 111. In an embodiment the first semiconductor device 401 and the second semiconductor device 403 are semiconductor devices designed for an intended purpose such as individually being a logic die, a central processing unit (CPU) die, a memory die, combinations of these, or the like. In an embodiment the first semiconductor device 401 and the second semiconductor device 403 comprise integrated circuit devices (not shown), such as transistors, capacitors, inductors, resistors, first metallization layers (not shown), and the like, therein, as desired for a particular functionality. In an embodiment the first semiconductor device 401 and the second semiconductor device 403 are designed and manufactured to work in conjunction with other semiconductor devices (not illustrated in FIG. 4). The first semiconductor device 401 and the second semiconductor device 403 may be attached to the first passivation layer 111 using, e.g., an adhesive material, although any suitable method of attachment may alternatively be utilized.

In an embodiment the first semiconductor device 401 comprises a first substrate, first active devices, first metallization layers, and first contact pads (not separately illustrated). The first substrate may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active devices within the first semiconductor device 401 comprise a wide variety of active devices and passive devices such as capacitors, resistors, inductors and the like that may be used to generate the desired structural and functional desires of the design for the first semiconductor device 401. The first active devices within the first semiconductor device 401 may be formed using any suitable methods either within or else on the second substrate.

The first metallization layers are formed over the first substrate and the first active devices within the first semiconductor device 401 and are designed to connect the various active devices within the first semiconductor device 401 to form functional circuitry. In an embodiment the first metallization layers are formed of alternating layers of dielectric and conductive material and may be formed through any suitable process (such as deposition, damascene, dual damascene, etc.). In an embodiment there may be four layers of metallization separated from the second substrate by at least one interlayer dielectric layer (ILD), but the precise number of first metallization layers is dependent upon the design of the first semiconductor device 401.

The first contact pads may be formed over and in electrical contact with the first metallization layers. The first contact pads may comprise aluminum, but other materials, such as copper, may alternatively be used. The first contact pads may be formed using a deposition process, such as sputtering, to form a layer of material (not shown) and portions of the layer of material may then be removed through a suitable process (such as photolithographic masking and etching) to form the first contact pads. However, any other suitable process may be utilized to form the first contact pads. The first contact pads may be formed to have a thickness of between about 0.5 μm and about 4 μm, such as about 1.45 μm.

The second semiconductor device 403 may be similar to the first semiconductor device 401. For example, the second semiconductor device 403 may comprise a second substrate, second active devices, second metallization layers, and second contact pads that are similar to the first substrate, first active devices, first metallization layers, and first contact pads, respectively. However, the second semiconductor device 403 may alternatively have different devices and structures than the first semiconductor device 401.

Figure 5:
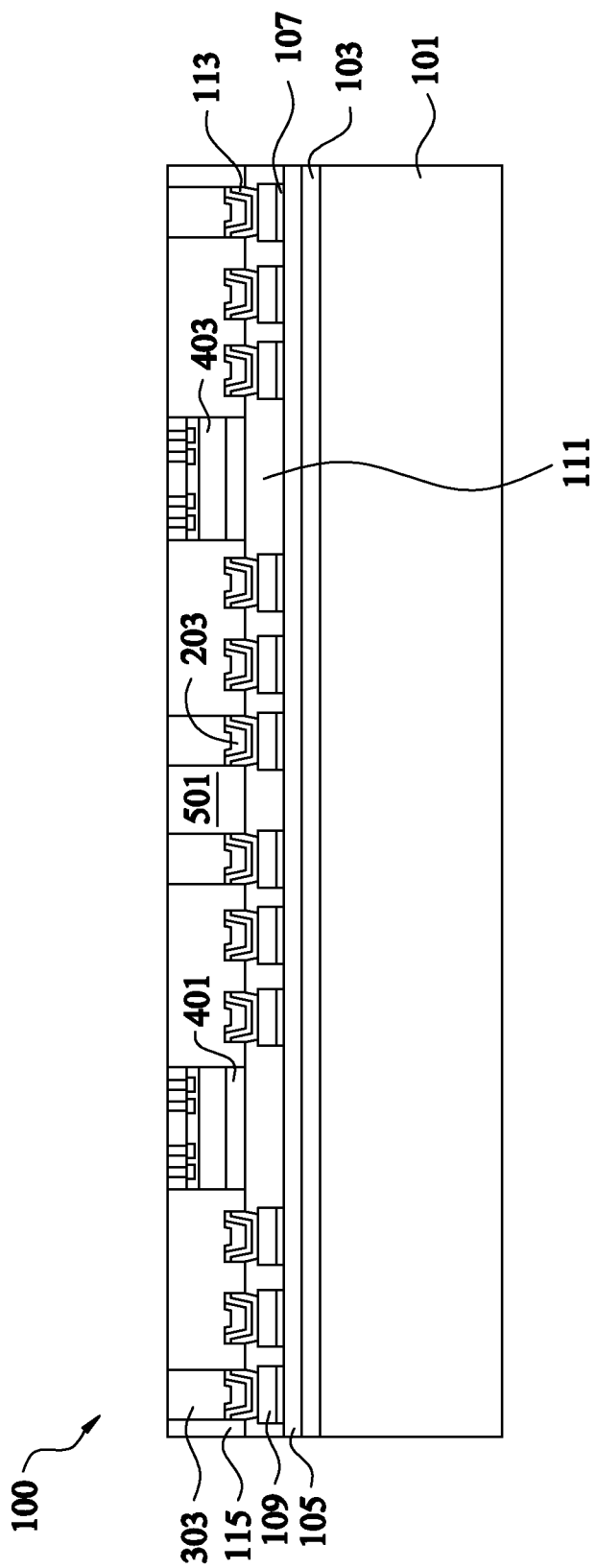
FIG. 5 illustrates an encapsulation in accordance with some embodiments.

FIG. 5 illustrates an encapsulation of the through vias 303, the first semiconductor device 401 and the second semiconductor device 403 with a first encapsulant 501. The encapsulation may be performed in a molding device (not individually illustrated in FIG. 5). For example, the first semiconductor device 401, the second semiconductor device 403, and the through vias 303 may be placed within a cavity of the molding device, and the cavity may be hermetically sealed. The first encapsulant 501 may be placed within the cavity either before the cavity is hermetically sealed or else may be injected into the cavity through an injection port. In an embodiment the first encapsulant 501 may be a molding compound resin such as polyimide, PPS, PEEK, PES, a heat resistant crystal resin, combinations of these, or the like.

Once the first encapsulant 501 has been placed into the molding cavity such that the first encapsulant 501 encapsulates the carrier substrate 101, the through vias 303, the first semiconductor device 401, and the second semiconductor device 403, the first encapsulant 501 may be cured in order to harden the first encapsulant 501 for optimum protection. While the exact curing process is dependent at least in part on the particular material chosen for the first encapsulant 501, in an embodiment in which molding compound is chosen as the first encapsulant 501, the curing could occur through a process such as heating the first encapsulant 501 to between about 100° C. and about 130° C., such as about 125° C. for about 60 sec to about 3000 sec, such as about 600 sec. Additionally, initiators and/or catalysts may be included within the first encapsulant 501 to better control the curing process.

However, as one having ordinary skill in the art will recognize, the curing process described above is merely an exemplary process and is not meant to limit the current embodiments. Other curing processes, such as irradiation or even allowing the first encapsulant 501 to harden at ambient temperature, may alternatively be used. Any suitable curing process may be used, and all such processes are fully intended to be included within the scope of the embodiments discussed herein.

Once the first encapsulant 501 has been placed, the first encapsulant 501 is thinned in order to expose the through vias 303, the first contact pads (within the first semiconductor device 401) and the second contact pads (within the second semiconductor device 403) for further processing. The thinning may be performed, e.g., using a mechanical grinding or chemical mechanical polishing (CMP) process whereby chemical etchants and abrasives are utilized to react and grind away the first encapsulant 501 until the through vias 303, the first contact pads, and the second contact pads have been exposed. As such, the first semiconductor device 401, the second semiconductor device 403, and the through vias 303 may have a planar surface that is also planar with the first encapsulant 501.

However, while the CMP process described above is presented as one illustrative embodiment, it is not intended to be limiting to the embodiments. Any other suitable removal process may alternatively be used to thin the first encapsulant 501 and expose the through vias 303, the first contact pads and the second contact pads. For example, a series of chemical etches may alternatively be utilized. This process and any other suitable process may alternatively be utilized to thin the first encapsulant 501 and expose the through vias 303, the first contact pads and the second contact pads, and all such processes are fully intended to be included within the scope of the embodiments.

Figure 6:
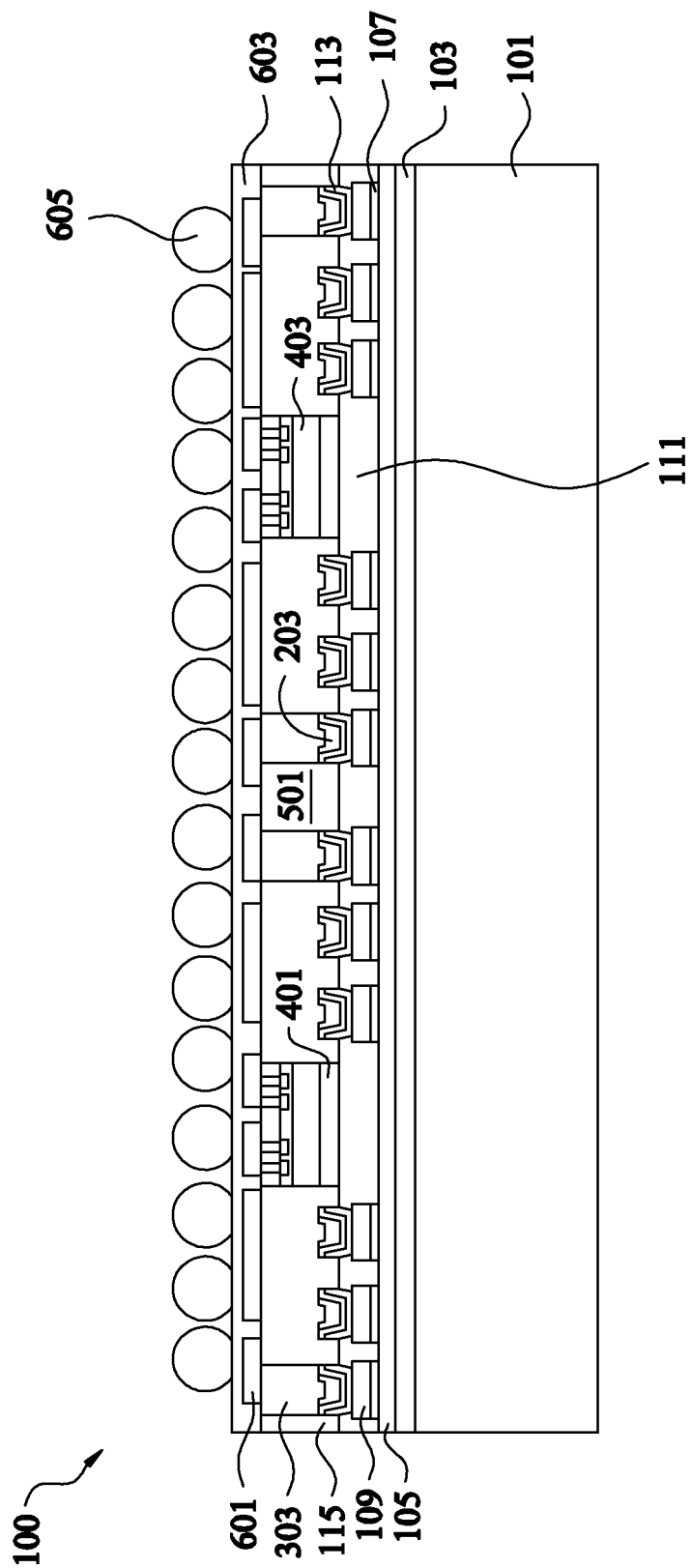
FIG. 6 illustrates a formation of a second redistribution layer in accordance with some embodiments.

FIG. 6 illustrates a formation of a second RDL 601, a second passivation layer 603, and a placement of first external connections 605. In an embodiment the second RDL 601 may be formed by initially forming a fourth seed layer (not separately illustrated in FIG. 6) over the first semiconductor device 401, the second semiconductor device 403, the through vias 303, and the first encapsulant 501. The fourth seed layer is a thin layer of a conductive material that aids in the formation of a thicker layer during subsequent processing steps. The fourth seed layer may comprise a layer of titanium about 1,000 Å thick followed by a layer of copper about 5,000 Å thick. The fourth seed layer may be created using processes such as sputtering, evaporation, or PECVD processes, depending upon the desired materials. The fourth seed layer may be formed to have a thickness of between about 0.3 μm and about 1 μm, such as about 0.5 μm.

Once the fourth seed layer has been formed, a fourth photoresist may be placed and patterned over the fourth seed layer. In an embodiment the fourth photoresist may be placed on the fourth seed layer using, e.g., a spin coating technique to a height of between about 50 μm and about 250 μm, such as about 120 μm. Once in place, the fourth photoresist may then be patterned by exposing the fourth photoresist to a patterned energy source (e.g., a patterned light source) so as to induce a chemical reaction, thereby inducing a physical change in those portions of the fourth photoresist exposed to the patterned light source. A developer is then applied to the exposed fourth photoresist to take advantage of the physical changes and selectively remove either the exposed portion of the fourth photoresist or the unexposed portion of the fourth photoresist, depending upon the desired pattern. In an embodiment the pattern formed into the fourth photoresist is a pattern that exposes the fourth seed layer where the second RDL 601 is desired to be formed.

Once the fourth photoresist has been patterned, the second RDL 601 is formed within the fourth photoresist. In an embodiment the second RDL 601 comprises one or more conductive materials, such as copper, tungsten, other conductive metals, or the like, and may be formed, for example, by electroplating, electroless plating, or the like. In an embodiment, an electroplating process is used wherein the fourth seed layer and the fourth photoresist are submerged or immersed in an electroplating solution. The fourth seed layer surface is electrically connected to the negative side of an external DC power supply such that the fourth seed layer functions as the cathode in the electroplating process. A solid conductive anode, such as a copper anode, is also immersed in the solution and is attached to the positive side of the power supply. The atoms from the anode are dissolved into the solution, from which the cathode, e.g., the fourth seed layer, acquires the dissolved atoms, thereby plating the exposed conductive areas of the fourth seed layer within the opening of the fourth photoresist.

Once the second RDL layer 601 has been formed using the fourth photoresist and the fourth seed layer, the fourth photoresist may be removed using a suitable removal process. In an embodiment, a plasma ashing process may be used to remove the fourth photoresist, whereby the temperature of the fourth photoresist may be increased until the fourth photoresist experiences a thermal decomposition and may be removed. However, any other suitable process, such as a wet strip, may alternatively be utilized. The removal of the fourth photoresist may expose the underlying portions of the fourth seed layer.

After the removal of the fourth photoresist exposes the underlying fourth seed layer, these portions are removed. In an embodiment the exposed portions of the fourth seed layer (e.g., those portions that are not covered by the second RDL 601) may be removed by, for example, a wet or dry etching process. For example, in a dry etching process reactants may be directed towards the fourth seed layer, using the second RDL layer 601 as a mask. Alternatively, etchants may be sprayed or otherwise put into contact with the fourth seed layer in order to remove the exposed portions of the fourth seed layer.

The second passivation layer 603 may be formed over the second RDL 601 in order to provide protection and isolation for the second RDL 601 and the other underlying structures. In an embodiment the second passivation layer 603 may be polybenzoxazole (PBO), although any suitable material, such as polyimide or a polyimide derivative, may alternatively be utilized. The second passivation layer 603 may be placed using, e.g., a spin-coating process to a thickness of between about 5 µm and about 25 µm, such as about 7 µm, although any suitable method and thickness may alternatively be used. Once in place, portions of the second RDL 601 may be exposed through the second passivation layer 603 by removing a portion of the second passivation layer 603 through a process such as photolithographic masking and etching or chemical mechanical polishing (CMP), although any suitable removal process may alternatively be utilized.

Optionally, if desired, a third RDL layer (not separately illustrated in FIG. 6) may be formed over the second RDL 601. For example, the processes described above to form the second RDL 601 may be repeated in order to form the third RDL layer over the second passivation layer 603 and in contact with the second RDL 601. Additionally, the process may be repeated as many times as desired to form any desired number of RDL layers.

Once the second passivation layer 603 has been formed and patterned, the first external connections 605 may be placed or formed within the openings through the second passivation layer 603 to make electrical contact with the second RDL 601 (or, optionally, to the third RDL layer or uppermost RDL layer). To place the first external connections 605, an underbump metallization (UBM—not separately illustrated in FIG. 6) may be initially formed within the openings. In an embodiment the UBM comprises three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM. Any suitable materials or layers of material that may be used for the UBM are fully intended to be included within the scope of the embodiments.

In an embodiment the UBM is created by forming each layer over the second RDL 601 and along the interior of the openings through the second passivation layer 603. The forming of each layer may be performed using a plating process, such as electrochemical plating, although other processes of formation, such as sputtering, evaporation, or PECVD process, may alternatively be used depending upon the desired materials. The UBM may be formed to have a thickness of between about 0.7 µm and about 10 µm, such as about 5 µm. Once each layer has been formed, the individually layers may be patterned into the UBMs through, e.g., a suitable photolithographic masking and etching process.

In an embodiment the first external connections 605 may be contact bumps and may comprise a material such as tin, or other suitable materials, such as silver, lead-free tin, or copper. In an embodiment in which the first external connections 605 are tin solder bumps, the first external connections 605 may be formed by initially forming a layer of tin through such commonly used methods such as evaporation, electroplating, printing, solder transfer, ball placement, etc, to a thickness of, e.g., about 100 µm. Once a layer of tin has been formed on the structure, a reflow may be performed in order to shape the material into the desired bump shape.

Once the first external connections 605 have been formed, the devices may be tested in order to determine which ones are suitable for additional manufacturing and which ones are defective and need to be discarded or recycled. In an embodiment, electrical connections are made to the first external connections 605 and a series of test signals are applied through the first external connections 605 to, e.g., the first semiconductor device 401 and the second semiconductor device 403. Signals are then received out of the devices and analyzed to ensure that the devices were manufactured and connected appropriately.

Figure 7:
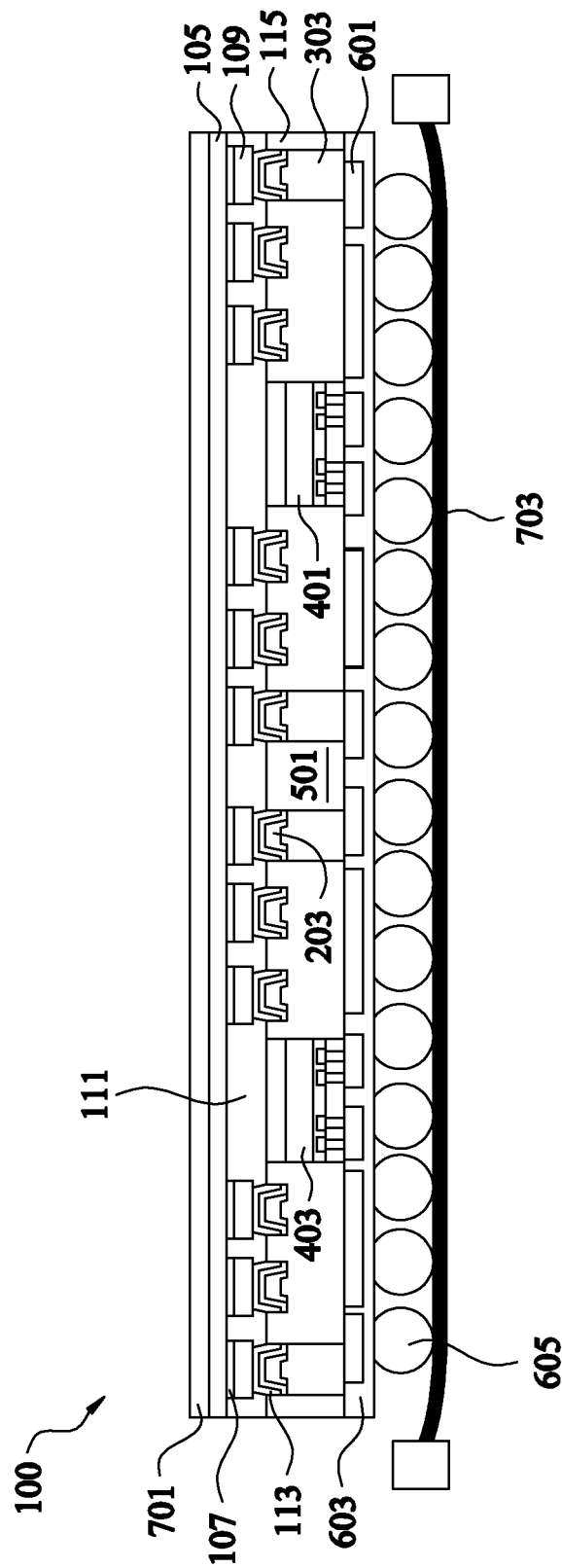
FIG. 7 illustrates a removal of the carrier wafer in accordance with some embodiments.

FIG. 7 illustrates a debonding of the carrier substrate 101 and the adhesive layer 103, and a placement of a support 703. In an embodiment the carrier substrate 101 may be removed by a physical, thermal, or ultraviolet process, depending upon the material chosen for the adhesive layer 103. In an embodiment in which the adhesive layer 103 thermally decomposes, the adhesive layer 103 may be heated, causing it to reduce or lose its adhesiveness. The carrier substrate 101 may then be physically separated from the polymer layer 105.

Once the carrier wafer 101 has been removed, a support 703 may be placed onto the first external connections 605 in order to provide support for additional processing. In an embodiment the support 703 is a tape that is placed using a lamination process. For example, a Solder Resistance (SR), Lamination Compound (LC), or Ajinomoto build-up film (ABF) tape may be used, although any other suitable type of support may alternatively be used.

FIG. 7 also illustrates a formation of a third passivation layer 701 over the polymer layer 105. In an embodiment the third passivation layer 701 may be polybenzoxazole (PBO), although any suitable material, such as polyimide or a polyimide derivative, may alternatively be utilized. The third passivation layer 701 may be placed using, e.g., a spin-coating process to a thickness of between about 5 µm and about 25 µm, such as about 7 µm, although any suitable method and thickness may alternatively be used.

Figure 8:
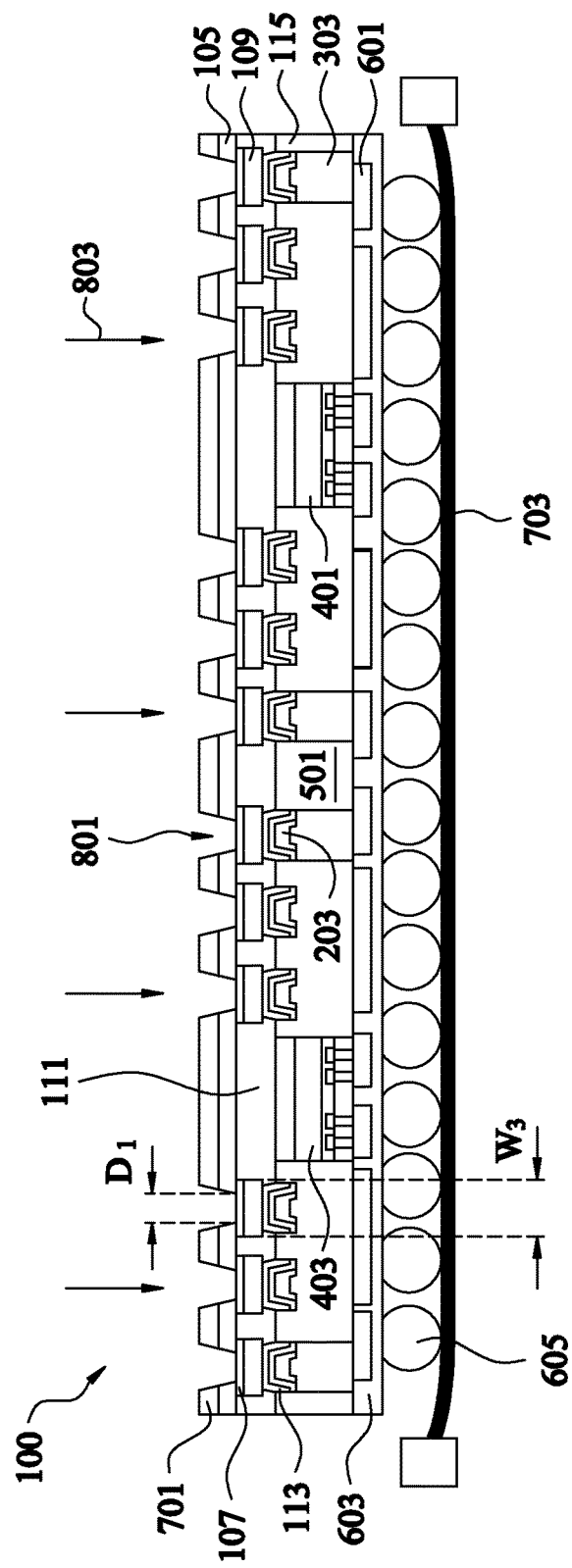
FIG. 8 illustrates a patterning of a passivation layer in accordance with some embodiments.

FIG. 8 illustrates that, once the third passivation layer 701 has been formed, openings 801 within the third passivation layer 701 and the polymer layer 105 may be formed in order to expose portions of the first RDL 109 (with the first seed layer 107). In an embodiment the openings 801 may be formed using a removal or exposure process (represented in FIG. 8 by the arrow labeled 803) such as a laser drilling process. In an embodiment the laser drilling process may be performed using, e.g., a carbon dioxide ($CO_2$) laser, although any suitable laser may alternatively be used. During the laser drilling process the drill energy may be in a range from 0.1 mJ to about 30 mJ, and a drill angle of about 0 degree (perpendicular to the third passivation layer 701) to about 85 degrees to normal of the third passivation layer 701. In some embodiments, the drill time is in a range from about 1 µs to about 150 µs for each desired opening.

In an embodiment the openings 801 may have a first diameter $D_1$ that is less than a third width $W_3$ of the underlying first RDL 109. For example, in an embodiment in which the underlying first RDL layer 109 has the third width $W_3$ of between about 50 µm and about 500 µm, such as about 250 µm, the openings 801 may have the first diameter $D_1$ of between about 50 µm and about 500 µm, such as about 250 µm. However, any suitable diameters may alternatively be utilized.

However, as one of ordinary skill in the art will recognize, the laser drilling process described above is only an illustrative embodiment and is not intended to be limiting to the embodiments. Rather, any suitable removal or exposure process may alternatively be used. All such processes are fully intended to be included within the scope of the embodiments.

By utilizing the back-side dummy pattern 203 in conjunction with the first RDL 109, the first RDL 109 and the back-side dummy pattern 203 form a thicker structure than the first RDL 109 by itself. As such, with the thicker structure, damage caused by the exposure process, and especially the laser drilling process, can be reduced or eliminated. This allows for a larger window for the removal process to get a larger Bottom Critical Dimension (BCD).

Optionally, a cleaning process may be utilized after the formation of the openings 801 within the third passivation layer 701 and the polymer layer 105 in order to remove any residual material left behind by the exposure process 803. The plasma clean process may also remove a portion of the exposed surfaces of the third passivation layer 701 and the polymer layer 105. In an embodiment, the plasma clean process is performed using an oxygen plasma, or the like, in an inert atmosphere such a nitrogen, argon, or the like.

Figure 9:
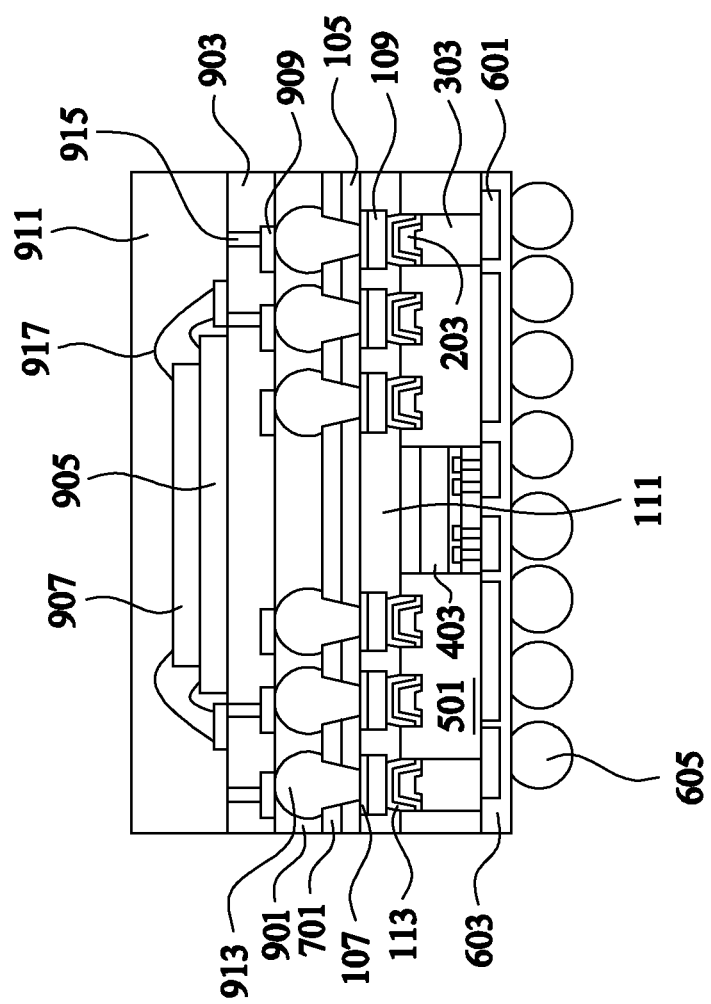
FIG. 9 illustrates a bonding of a package in accordance with some embodiments.

FIG. 9 illustrates a singulation of the first package 100 and a bonding of the first package 100 to a second package 900. In an embodiment the first package 100 (comprising, e.g., the first semiconductor device 401) may be singulated from the remainder of the other packages (comprising, e.g., the second semiconductor device 403).

In an embodiment the singulation may be performed by using a saw blade (not shown) to slice a region between the first package 100 and the remainder of the other packages, thereby separating the first package 100 from the other packages. Additionally, the saw blade also cuts through the first encapsulant 501 located around the first semiconductor device 401, causing the first encapsulant 501 to be aligned along the cut.

However, as one of ordinary skill in the art will recognize, utilizing a saw blade to singulate the first package 100 is merely one illustrative embodiment and is not intended to be limiting. Alternative methods for singulating the first package 100, such as utilizing one or more etches to separate the first package 100, may alternatively be utilized. These methods and any other suitable methods may alternatively be utilized to singulate the first package 100.

The second package 900 may comprise a third substrate 903, a third semiconductor device 905, a fourth semiconductor device 907 (bonded to the third semiconductor device 905), third contact pads 909, a second encapsulant 911, and second external connections 913. In an embodiment the third substrate 903 may be, e.g., a packaging substrate comprising internal interconnects to connect the third semiconductor device 905 to the first package 100.

Alternatively, the third substrate 903 may be an interposer used as an intermediate substrate to connect the third semiconductor device 905 to the first package 100. In this embodiment the third substrate 903 may be, e.g., a silicon substrate, doped or undoped, or an active layer of a silicon-on-insulator (SOI) substrate. However, the third substrate 903 may alternatively be a glass substrate, a ceramic substrate, a polymer substrate, or any other substrate that may provide a suitable protection and/or interconnection functionality. These and any other suitable materials may alternatively be used for the third substrate 903.

The third semiconductor device 905 may be a semiconductor device designed for an intended purpose such as being a logic die, a central processing unit (CPU) die, a memory die (e.g., a DRAM die), combinations of these, or the like. In an embodiment the third semiconductor device 905 comprises integrated circuit devices, such as transistors, capacitors, inductors, resistors, first metallization layers (not shown), and the like, therein, as desired for a particular functionality. In an embodiment the third semiconductor device 905 is designed and manufactured to work in conjunction with or concurrently with the first semiconductor device 401 or the second semiconductor device 403.

The fourth semiconductor device 907 may be similar to the third semiconductor device 905. For example, the fourth semiconductor device 907 may be a semiconductor device designed for an intended purpose (e.g., a DRAM die) and comprising integrated circuit devices for a desired functionality. In an embodiment the fourth semiconductor device 907 is designed to work in conjunction with or concurrently with the first semiconductor device 401, the second semiconductor device 403, and/or the third semiconductor device 905.

The fourth semiconductor device 907 may be bonded to the third semiconductor device 905. In an embodiment the fourth semiconductor device 907 is only physically bonded with the third semiconductor device 905, such as by using an adhesive. In this embodiment the fourth semiconductor device 907 and the third semiconductor device 905 may be electrically connected to the third substrate 903 using, e.g., wire bonds 917, although any suitable electrical bonding may be alternatively be utilized.

Alternatively, the fourth semiconductor device 907 may be bonded to the third semiconductor device 905 both physically and electrically. In this embodiment the fourth semiconductor device 907 may comprise third external connections (not separately illustrated in FIG. 9) that connect with fourth external connection (also not separately illustrated in FIG. 9) on the third semiconductor device 905 in order to interconnect the fourth semiconductor device 907 with the third semiconductor device 905.

The third contact pads 909 may be formed on the third substrate 903 to form electrical connections between the third semiconductor device 905 and, e.g., the second external connections 913. In an embodiment the third contact pads 909 may be formed over and in electrical contact with electrical routing (such as through substrate vias 915) within the third substrate 903. The third contact pads 909 may comprise aluminum, but other materials, such as copper, may alternatively be used. The third contact pads 909 may be formed using a deposition process, such as sputtering, to form a layer of material (not shown) and portions of the layer of material may then be removed through a suitable process (such as photolithographic masking and etching) to form the third contact pads 909. However, any other suitable process may be utilized to form the third contact pads 909. The third contact pads 909 may be formed to have a thickness of between about 0.5 µm and about 4 µm, such as about 1.45 µm.

The second encapsulant 911 may be used to encapsulate and protect the third semiconductor device 905, the fourth semiconductor device 907, and the third substrate 903. In an embodiment the second encapsulant 911 may be a molding compound and may be placed using a molding device (not illustrated in FIG. 9). For example, the third substrate 903, the third semiconductor device 905, and the fourth semiconductor device 907 may be placed within a cavity of the molding device, and the cavity may be hermetically sealed. The second encapsulant 911 may be placed within the cavity either before the cavity is hermetically sealed or else may be injected into the cavity through an injection port. In an embodiment the second encapsulant 911 may be a molding compound resin such as polyimide, PPS, PEEK, PES, a heat resistant crystal resin, combinations of these, or the like.

Once the second encapsulant 911 has been placed into the cavity such that the second encapsulant 911 encapsulates the region around the third substrate 903, the third semiconductor device 905, and the fourth semiconductor device 907, the second encapsulant 911 may be cured in order to harden the second encapsulant 911 for optimum protection. While the exact curing process is dependent at least in part on the particular material chosen for the second encapsulant 911, in an embodiment in which molding compound is chosen as the second encapsulant 911, the curing could occur through a process such as heating the second encapsulant 911 to between about 100° C. and about 130° C., such as about 125° C. for about 60 sec to about 3000 sec, such as about 600 sec. Additionally, initiators and/or catalysts may be included within the second encapsulant 911 to better control the curing process.

However, as one having ordinary skill in the art will recognize, the curing process described above is merely an exemplary process and is not meant to limit the current embodiments. Other curing processes, such as irradiation or even allowing the second encapsulant 911 to harden at ambient temperature, may alternatively be used. Any suitable curing process may be used, and all such processes are fully intended to be included within the scope of the embodiments discussed herein.

In an embodiment the second external connections 913 may be formed to provide an external connection between the third substrate 903 and, e.g., the first RDL 109. The second external connections 913 may be contact bumps such as microbumps or controlled collapse chip connection (C4) bumps and may comprise a material such as tin, or other suitable materials, such as silver or copper. In an embodiment in which the second external connections 913 are tin solder bumps, the second external connections 913 may be formed by initially forming a layer of tin through any suitable method such as evaporation, electroplating, printing, solder transfer, ball placement, etc, to a thickness of, e.g., about 100 µm. Once a layer of tin has been formed on the structure, a reflow is performed in order to shape the material into the desired bump shape.

In an embodiment the second package 900 may be bonded to the redistribution layer by initially forming a protective layer on the exposed portions of the first RDL 109 in order to protect the first RDL 109. In an embodiment the protective layer may be a solder paste or oxygen solder protection (OSP).

Once the protective layer has been formed, the second external connections 913 are aligned with the openings 801 (formed by the laser drill as illustrated in FIG. 8). Once aligned the second external connections 913 are placed into contact with the first RDL 109 and a bonding is performed. For example, in an embodiment in which the second external connections 913 are solder bumps, the bonding process may comprise a reflow process whereby the temperature of the second external connections 913 is raised to a point where the second external connections 913 will liquefy and flow, thereby bonding the second package 900 to the first RDL 109 once the second external connections 913 resolidifies, which may form, e.g., an intermetallic compound (IMC) layer.

FIG. 9 additionally illustrates an optional step of applying an underfill material 901 between the second package 900 and the first package 100. In an embodiment the underfill material 901 is a protective material used to cushion and support the first package 100 and the second package 900 from operational and environmental degradation, such as stresses caused by the generation of heat during operation. The underfill material 901 may be injected or otherwise formed in the space between the first package 100 and the second package 900 and may, for example, comprise a liquid epoxy that is dispensed between the first package 100 and the second package 900, and then cured to harden.

By utilizing the back-side dummy pattern 203 along with the first RDL 109, the damage caused by the exposure process 803 may be reduced. This helps increase the ball strength on the first RDL 109. Additionally, by increasing the ball strength, a better joint for the bonding process may be achieved, and failure of the joint may be reduced or eliminated.

Figure 10:
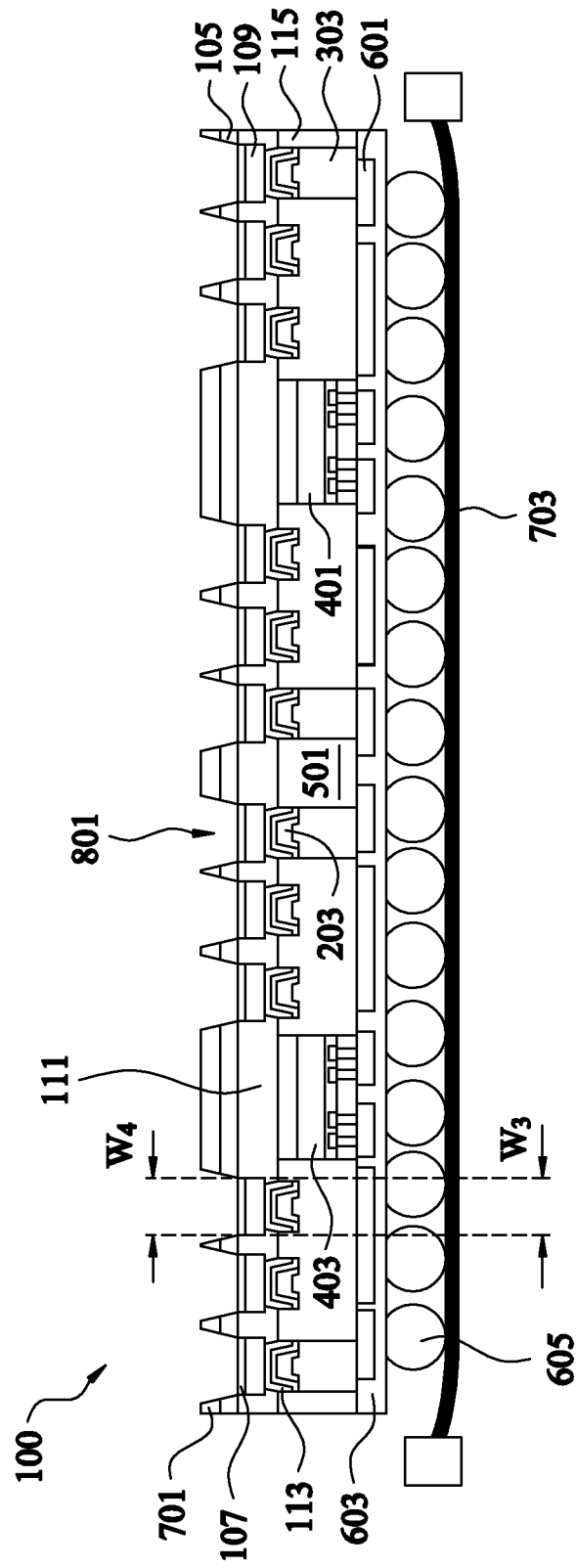
FIG. 10 illustrates another patterning of the passivation layer in accordance with some embodiments.

FIG. 10 illustrates an embodiment in which the removal or exposure process 803 forms the openings 801 to have a fourth width $W_4$ that is greater than the third width $W_3$ of the first RDL 109. For example, in an embodiment in which the first RDL layer 109 has the third width $W_3$ as described above with respect to FIG. 8, the openings 801 may be formed to have the fourth width $W_4$ of between about 50 µm and about 500 µm, such as about 250 µm. However, any suitable width may alternatively be used for the fourth width $W_4$.

In accordance with an embodiment, a semiconductor device comprising a redistribution layer with a first portion and a second portion is provided. A through via is in connection with the first portion, the through via extending through an encapsulant. A first dummy portion is in connection with the second portion, the first dummy portion in physical contact with the encapsulant, and a first die is embedded within the encapsulant.

In accordance with another embodiment, a semiconductor device comprising a first die and an encapsulant in contact with and extending away from a sidewall of the first die is provided. A through via is laterally separated from the first die and extends through the encapsulant. A first redistribution layer is over the encapsulant, wherein a first portion of the first redistribution layer is in contact with the through via, and a conductive dummy portion is in contact with a second portion of the first redistribution layer, the conductive dummy portion being located at least partially between the first die and the through via but not extending through the encapsulant.

In accordance with yet another embodiment, a method of manufacturing a semiconductor device comprising forming a first redistribution layer on a substrate and forming a conductive dummy region on a first portion of the first redistribution layer is provided. A through via is plated on a second portion of the redistribution layer but not on the first portion of the first redistribution layer. A first die is attached laterally separated from the through via, and the first die, the conductive dummy region, and the through via are encapsulated with an encapsulant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first redistribution layer on a substrate;
   plating conductive features on a first side of the first redistribution layer until the conductive features have a first thickness;
   covering a first subset of the conductive features with a first photoresist, a second subset of the conductive features not covered by the first photoresist;
   plating the second subset of the conductive features until the second subset of the conductive features have a second thickness greater than the first thickness;
   removing the first photoresist;
   after removing the first photoresist, attaching a die to the first redistribution layer, the die laterally separated from the conductive features;
   encapsulating the die and the conductive features with an encapsulant;
   after encapsulating the die, removing the substrate;
   after removing the substrate, forming a lower passivation layer on a second side of the first redistribution layer;
   forming openings through the lower passivation layer to expose portions of the first redistribution layer connected to the conductive features; and
   forming solder bumps on exposed portions of the first redistribution layer in the openings, wherein the first redistribution layer is interposed between the conductive features and the solder bumps.

2. The method of claim 1, wherein the plating the conductive features on the first redistribution layer comprises:
   forming an upper passivation layer over the first redistribution layer;
   patterning the upper passivation layer with openings exposing the first redistribution layer;
   depositing a seed layer over the upper passivation layer and in the openings; and
   plating the conductive features from the seed layer.

3. The method of claim 2, further comprising:
   removing portions of the seed layer not covered by the conductive features to expose a portion of the upper passivation layer between each of the conductive features.

4. The method of claim 3, wherein:
   the conductive features have a first width after the plating the conductive features on the first redistribution layer, and
   the conductive features have a second width after the removing the portions of the seed layer, the first width greater than the second width.

5. The method of claim 2, wherein the plating the conductive features from the seed layer comprises:
   forming a second photoresist over the seed layer;
   patterning the second photoresist to form openings over each of the openings of the upper passivation layer; and
   electroplating conductive material from the seed layer in the openings of the upper passivation layer.

6. The method of claim 1, wherein the plating the second subset of the conductive features comprises:
   patterning the first photoresist to form openings over each of the second subset of the conductive features; and
   electroplating conductive material from the second subset of the conductive features through the openings of the first photoresist.

7. The method of claim 1, further comprising:
   planarizing the encapsulant such that top surfaces of the encapsulant, the die, and the second subset of the conductive features are level.

8. The method of claim 1, further comprising:
   forming a second redistribution layer over the encapsulant, the die, and the conductive features.

9. The method of claim 1, further comprising bonding a package to the back side of the first redistribution layer with the solder bumps.

10. The method of claim 1, wherein:
    the conductive features have a first width after the plating the conductive features on the first redistribution layer; and
    the openings through the lower passivation layer have a second width, the first width different from the second width.

11. The method of claim 1, wherein the plating the second subset of the conductive features is performed after the covering the first subset of the conductive features with the first photoresist.

12. A method comprising:
    forming a first package comprising:
      forming a first redistribution layer on a substrate;

forming a first passivation layer over a front side of the first redistribution layer;

patterning the first passivation layer with openings exposing the first redistribution layer;

forming vias extending from the first redistribution layer and through a first subset of the openings of the first passivation layer;

forming conductive dummy features extending from the first redistribution layer and through a second subset of the openings of the first passivation layer, wherein the conductive dummy features and a portion of the vias are formed in a first plating step, wherein remaining portions of the vias are formed in a second plating step, and wherein the conductive dummy features are covered during the second plating step;

after forming the conductive dummy features, attaching a first die laterally separated from the vias and the conductive dummy features; and encapsulating the first die, the vias, and the conductive dummy features with an encapsulant; and attaching a second package to a back side of the first redistribution layer.

13. The method of claim 12, further comprising using laser drilling to expose portions of the first redistribution layer.

14. The method of claim 13, wherein the laser drilling comprises a drill energy in a range from 0.1 mJ to about 30 mJ.

15. A method comprising:

forming a first redistribution layer on a substrate;

forming a conductive dummy region on a first portion of the first redistribution layer;

plating a through via on a second portion of the first redistribution layer but not on the first portion of the first redistribution layer, wherein the conductive dummy region and a first through via portion are physically separate and formed in a first plating step, wherein remaining portions of the through via are formed in a second plating step, and wherein the conductive dummy region is covered during the second plating step;

after plating the through via, attaching a first die laterally separated from the through via; and encapsulating the first die, the conductive dummy region, and the through via with an encapsulant.

16. The method of claim 15, wherein the forming the conductive dummy region and the through via comprises:

forming a dielectric layer over the first redistribution layer;

patterning the dielectric layer to expose the first portion and the second portion of the first redistribution layer;

depositing a seed layer in contact with the first portion and the second portion of the first redistribution layer; and wherein the first plating step comprises plating a conductive material to form the conductive dummy region on the seed layer over the first portion and to form the first through via portion over the second portion.

17. The method of claim 16, wherein the second plating step comprises plating the remaining portions of the through via on the first through via portion.

18. The method of claim 15, further comprising thinning the encapsulant to expose the through via.

19. The method of claim 18, further comprising forming a second redistribution layer on a side of the encapsulant opposite the first redistribution layer.

20. The method of claim 15, further comprising:

forming a passivation layer in contact with the first redistribution layer; and laser drilling an opening through the passivation layer to expose the first portion of the first redistribution layer.

* * * * *